US010808903B2

(12) United States Patent
Goldmann et al.

(10) Patent No.: US 10,808,903 B2
(45) Date of Patent: Oct. 20, 2020

(54) LIGHT CONVERTING DEVICE WITH CERAMIC PROTECTION LAYER

(71) Applicant: Lumileds Holding B.V., Schiphol (NL)

(72) Inventors: Claudia Goldmann, Aachen (DE); Rainald Gierth, Aachen (DE); Ulrich Hechtfischer, Aachen (DE); Josef Schug, Aachen (DE)

(73) Assignee: LUMILEDS HOLDING B.V. (NL)

( * ) Notice: Subject to any disclaimer, the term of this patent is extended or adjusted under 35 U.S.C. 154(b) by 0 days.

(21) Appl. No.: 16/452,213

(22) Filed: Jun. 25, 2019

(65) Prior Publication Data

US 2019/0390835 A1    Dec. 26, 2019

(30) Foreign Application Priority Data

Jun. 26, 2018  (EP) .................................... 18179728

(51) Int. Cl.
*F21S 41/37* (2018.01)
*F21S 41/176* (2018.01)
(Continued)

(52) U.S. Cl.
CPC ............... *F21S 41/37* (2018.01); *F21S 41/16* (2018.01); *F21S 41/176* (2018.01); *F21S 45/47* (2018.01)

(58) Field of Classification Search
CPC .. F21S 41/37; F21S 45/47; F21S 41/16; F21S 41/176; F21V 9/30; F21V 29/505; F21V 29/502; F21V 9/32; F21K 9/64
See application file for complete search history.

(56) References Cited

U.S. PATENT DOCUMENTS

2015/0198303 A1\* 7/2015 Park ....................... C09K 11/02
428/210
2016/0040857 A1\* 2/2016 Inoue ................. C09K 11/7774
362/343

(Continued)

FOREIGN PATENT DOCUMENTS

EP    3309446 A1    4/2018

OTHER PUBLICATIONS

Extended European Search Report dated Jan. 2, 2019, European Patent Application No. 18179728.3, 10 pages.
(Continued)

*Primary Examiner* — Kevin Quarterman

(57) ABSTRACT

A light converting device, comprising:
a substrate functioning as a heatsink,
a light converter adapted to convert laser light to converted light, wherein a peak emission wavelength of the converted light is in a longer wavelength range than a laser peak emission wavelength of the laser light, the light converter comprises a light entrance surface, a bonding surface opposite to the light entrance surface and at least one side surface, the bonding surface is mechanically and thermally coupled to the substrate,
a reflective structure attached to or part of the substrate, wherein the reflective structure comprises at least one reflective metal surface arranged on the side of the substrate facing the light converter to reflect laser light and converted light, and
a translucent ceramic protection layer, arranged between the reflective structure and the light converter, and having a thickness of less than 50 μm.

13 Claims, 3 Drawing Sheets

(51) Int. Cl.
*F21S 41/16* (2018.01)
*F21S 45/47* (2018.01)

(56) References Cited

U.S. PATENT DOCUMENTS

2016/0138766 A1* 5/2016 Owada ................. F21V 29/505
  362/84
2017/0137706 A1* 5/2017 Fujita ....................... C09K 5/14
2018/0080629 A1* 3/2018 Inoue .................... F21V 29/505

OTHER PUBLICATIONS

PCT/EP2019/066157, EPO as ISA, "International Search Report and Written Opinion," dated Sep. 26, 2019, 11 pages.

* cited by examiner

LIGHT CONVERTING DEVICE WITH CERAMIC PROTECTION LAYER

CROSS REFERENCE TO RELATED APPLICATIONS

This application claims priority to European Patent Application No. 18179728.3 filed on Jun. 26, 2018 titled "LIGHT CONVERTING DEVICE WITH CERAMIC PROTECTION LAYER." European Patent Application No. 18179728.3 is incorporated herein by reference.

FIELD OF THE INVENTION

The invention relates to a light converting device with a ceramic protection layer, a laser-based light source comprising such a light converting device and a vehicle headlight comprising such a laser-based light source.

BACKGROUND OF THE INVENTION

In high luminance light sources often a light converting device is used that is excited by e.g. blue light emitted by a laser. A phosphor of the light converting device is coupled to a heatsink e.g. by means of a layer of glue or solder which is provided between the heatsink and the phosphor. Alternatively, as e.g. disclosed in US20170137706A1, the phosphor may be sandwiched in-between heat dissipating layers with a higher thermal conductivity than the phosphor, the heat dissipating layers conducting the heat generated in the phosphor away from the phosphor.

Still, the high-intensity especially of blue laser light and the high temperature caused by the light conversion by means of the phosphor may cause reliability issues. Furthermore, reliable heat dissipation e.g. by means of a substrate in combination with high optical efficiency (low absorption) is an issue.

SUMMARY OF THE INVENTION

It is an object of the present invention to provide an improved light converting device.

According to a first aspect a light converting device is provided. The light converting device comprises a light converter. The light converter is adapted to convert laser light to converted light. A peak emission wavelength of the converted light is in a longer wavelength range than a laser peak emission wavelength of the laser light. The light converter comprises a light entrance surface, a bonding surface opposite to the light entrance surface and at least one side surface. The bonding surface is mechanically and thermally coupled to a substrate functioning as a heatsink for the light converter. The light converting device further comprises a reflective structure attached to or part of the substrate. The reflective structure comprises at least one reflective metal surface arranged to reflect laser light and converted light. The reflective structure is arranged on the side of the substrate facing the light converter. The light converting device further comprises a translucent ceramic protection layer. The ceramic protection layer is arranged between the reflective structure and the light converter such that the reliability of the reflective structure is increased. The ceramic protection layer may inhibit mechanical damage of the reflective structure. The ceramic protection layer may further inhibit chemical reactions (e.g. corrosion) of the metallic surface comprised by the reflective structure. The ceramic protection layer may be arranged to scatter the laser light and converted light. The ceramic protection layer may, for example, comprise scattering structures (e.g. particles or pores) with a size between 10 nm and 10 µm (size of scattering structures and layer thickness of the ceramic protection layer are adapted such that the ceramic protection layer avoids direct exposure of the reflective structure). The reflectivity of the reflective structure is preferably more than 90%, more preferably more than 95% and most preferably more than 98% in the respective wavelength range (wavelength range of laser light and converted light). The reflective structure may be specular reflective especially in case of sufficient scattering of the laser and converted light already been provided by means of the light converter and/or the ceramic protection layer. The, for example, blue laser light and the converted light may alternatively or in addition be diffusely reflected by means of the reflective structure or a combination of the reflective structure and corresponding scattering elements within, for example, the light converter or the ceramic protection layer.

The light converter may, for example, be a thin (e.g. between 25 µm and 200 µm thick) rectangular or circular plate (maximum lateral extension e.g. less than 5 cm in scanning applications).

The substrate is arranged to dissipate heat, thus functions as a heatsink.

The ceramic protection layer may cover the reflective structure. The ceramic protection layer may, for example, be deposited or laminated on the metal surface to avoid degradation of the metal surface. The ceramic protection layer may, for example, be provided by means of plasma deposition, sol-gel processing or any other suitable deposition or lamination method.

The ceramic protection layer may comprise at least one ceramic material selected out of the group of aluminum oxide, magnesium oxide, titanium oxide, and zirconium oxide, preferably $Al_2O_3$ or $TiO_2$. The material and/or the thickness of the ceramic material is chosen such that the ceramic protection layer does not substantially absorb relevant parts of the laser light and the converted light. The absorption of laser light and converted light passing the ceramic protection layer is preferably less than 3%, more preferably less than 1% and most preferably less than 0.5%.

The substrate may, for example, comprise or consist of a metal like, for example, aluminum, copper, or steel. A surface of the metal may comprise at least one reflective metal surface forming the metal surface of the reflective structure. The metal surface may, for example, be a polished surface of the metal. The ceramic protection layer covers in this embodiment the polished surface as described above.

The reflective structure may alternatively comprise at least one metal layer deposited on a surface of the substrate facing the light converter. The metal layer may, for example, be a thin aluminum or silver layer. The ceramic protection layer covers in this embodiment the metal layer attached to the substrate.

The thickness of the ceramic protection layer is less than 50 µm and preferably less than 10 µm. The thickness is chosen such that optical performance and thermal conductivity to the substrate including the ceramic layer are sufficient to enable a highly efficient and reliable light converting device.

The light converter may be mechanically and thermally coupled to the substrate by, for example, a thin bonding layer (thickness preferably less than 3 µm, more preferably less than 1 µm) arranged between the bonding surface of the light converter and the ceramic protection layer. The bonding layer may, for example, be silicone glue dispensed on at least a part of the surface of the ceramic protection layer. The bonding layer may alternatively be a thin layer of glass melting at low temperatures (e.g. melting temperature being between 200° C. and 300° C.). The bonding layer is preferably highly transparent in order to avoid optical losses and corresponding heating of the bonding layer and the light converter. The limited thickness of the bonding layer may limit heating of the bonding layer.

The light converting device may further comprise a reflective side coating covering the at least one side surface of the light converter. The reflective side coating is arranged to reflect laser light and converted light such that optical losses via the at least one side surface of the light converter may be reduced. The reflective side coating may, for example, be a white coating. The reflective side coating may, for example, comprise an optical silicone filled with e.g. titanium oxide particles.

The substrate may according to an alternative embodiment comprise a slot. The slot is arranged to host the light converter. The light converter is positioned in the slot such that the bonding surface faces an inner bottom surface of the slot. The reflective structure is in this embodiment arranged at the bottom surface and optionally at the side surface of the slot such that laser light and converted light can be reflected by means of the reflective structure. The reflective structure is covered by the ceramic protection layer. A depth of the slot may be at least 80% or, more preferably, may be the same as a thickness of the light converter perpendicular to the bonding surface. The slot (or cavity) is slightly larger than the light converter. The light converter may be bonded to the reflective structure by means of a bonding layer. The bonding layer may, for example, comprise glue like silicone glue between the reflective structure and the light converter which is hardened by curing. The configuration of the bonding layer may be similar to the one as described above.

According to a further aspect, a laser-based light source is provided. The laser based light source comprises a light converting device as described above and at least one laser which is adapted to emit the laser light.

The laser-based light source may comprise two, three, four or more lasers (e.g. in the form of an array) emitting, for example, blue laser light.

According to a further aspect, a vehicle headlight is provided. The vehicle headlight comprises at least one laser-based light source as described above. The vehicle headlight may comprise two, three, four or more laser-based light sources as described above. The light converter may in this case comprise or consist of a yellow phosphor garnet (e.g. $Y_{(3-0.4)}Gd_{0.4}Al_5O_{12}$:Ce). A mixture of blue laser light and yellow converted light may be used to generate white light. Around 21% of the blue laser light may be reflected, and the remaining blue laser light may be converted to yellow light. This enables a ratio of 26% blue laser light and 74% yellow converted light in the mixed light emitted by the laser-based light source by taking into account, for example, Stokes losses in the phosphor.

It shall be understood that a preferred embodiment of the invention can also be any combination of the above described embodiments.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first embodiment of a laser-based light source with a light converting device.

FIG. 2 shows a principal sketch of a second embodiment of a laser-based light source with a light converting device.

FIG. 3 shows a principal sketch of a third embodiment of a laser-based light source with a light converting device.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
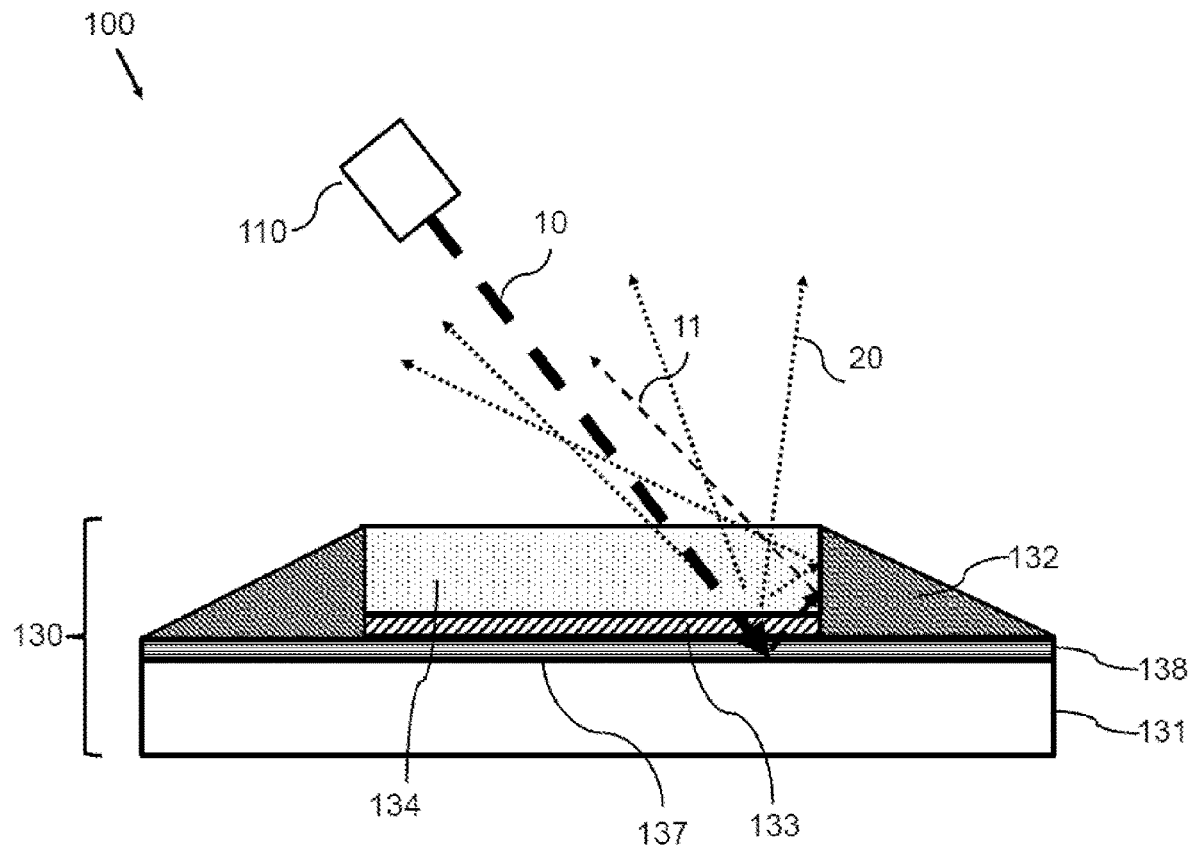

FIG. 1 shows a principal sketch of a first embodiment of a laser-based light source 100 comprising a light converting device 130. A light converter 134 like a rectangular phosphor platelet is glued by means of a bonding layer 133 to a substrate 131 which acts as a heatsink. The surface of the substrate 131 (being e.g. an aluminum substrate) the rectangular phosphor platelet is mounted on is highly reflective (obtained e.g. by polishing) and forms a reflective structure 137. A ceramic protection layer 138 consisting of $Al_2O_3$ with a layer thickness of around 20 μm is deposited on top of the reflective structure 137 such that the ceramic protection layer is arranged between the bonding layer 133 and the substrate 131. A reflective side coating 132 (e.g. titanium oxide filled optical silicone) covers the side surface or surfaces of the light converter 134. A laser 110 is arranged to emit blue laser light 10 which enters the light converter 134 (yellow phosphor garnet) via a light entrance surface of the light converter 134 which comprises an anti-reflective coating (not shown) avoiding reflection of light in the wavelength range of the laser light 10 and optionally the converted light 20. A part of the blue laser light 10 is converted to yellow converted light 20. A mixture of reflected blue laser light 11 which e.g. is reflected at the reflective structure 137 and converted light 20 is emitted via the light entrance surface. The laser-based light source 100 is arranged to emit white light which comprises the mixture of reflected laser light 11 and converted light 20.

Figure 2:
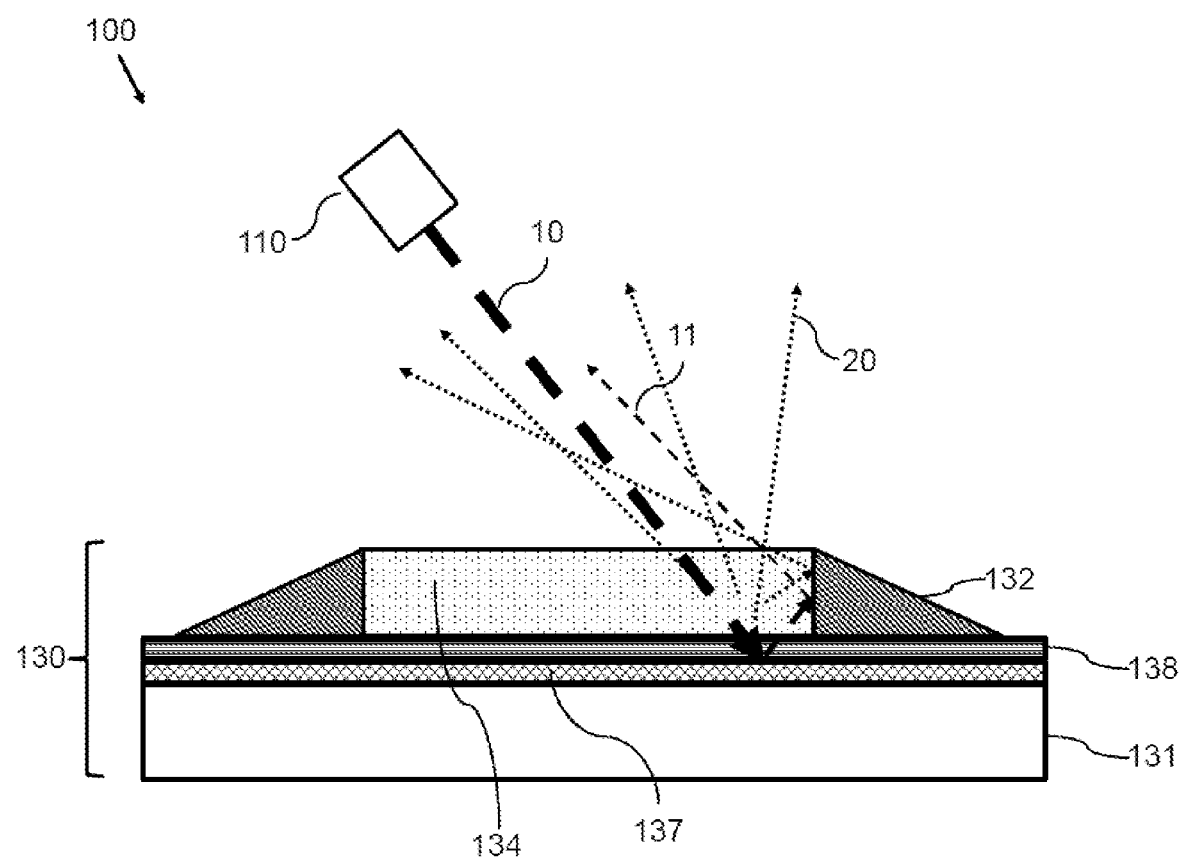

FIG. 2 shows a principal sketch of a second embodiment of a laser-based light source 100 with a light converting device 130. The light converting device 130 comprises a substrate 131 which acts as a heatsink. The substrate 131 further comprises a reflective structure 137. The reflective structure 137 comprises a reflective metal layer (e.g. silver layer) which is deposited on the surface of the substrate 131 on which a light converter 134 is mounted. The reflective metal layer is protected by means of a ceramic protection layer 138 (e.g. 10 μm aluminum oxide or titanium oxide) which is deposited on top of the reflective metal layer. The light converter 134 is clamped by means of a reflective side coating 132 on the ceramic protection layer 138 such that the ceramic protection layer 138 is arranged between the light converter 134 and the reflective structure 137.

The light converter 134 may alternatively be bonded to the ceramic protection layer 138 by means of, for example, a thermocompression bonding or ultrasonic bonding without any adhesive or bonding layer or by means of a bonding layer as described above.

Figure 3:
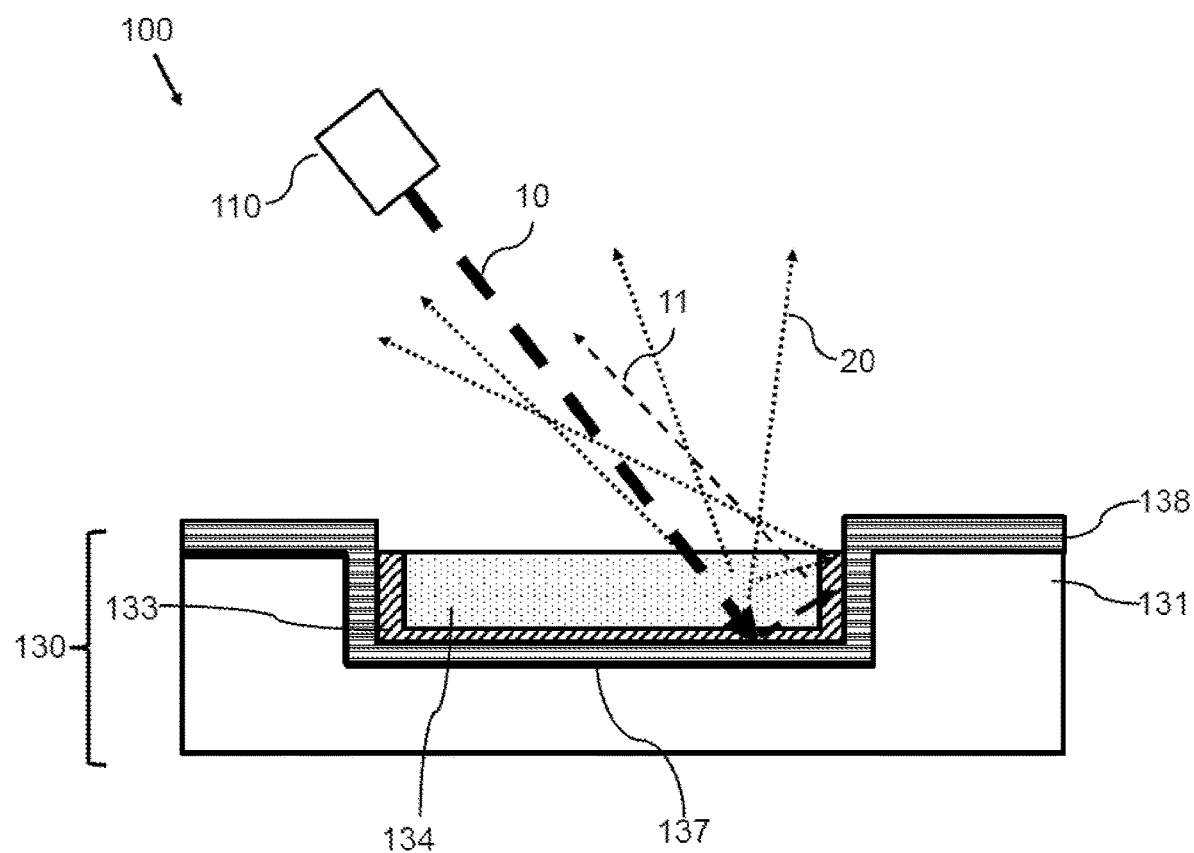

FIG. 3 shows a principal sketch of a third embodiment of a laser-based light source 100 with a light converting device 130. The substrate 131 consists in this embodiment of a block of metal in which a cavity or slot is provided (e.g. by deep-drawing). Other methods to shape the metal are well known to those skilled in the art. The metal may be in this case aluminum. The bottom of the cavity and the sidewalls are polished surfaces forming the reflective structure 137. The bottom of the cavity, the side walls and the top surface of the block surrounding the cavity are covered by a ceramic protection layer 138 (e.g. 10 μm $Al_2O_3$ with $TiO_2$ scattering particles). A small droplet of glue is dispensed in the cavity and the light converter 134 (e.g. platelet of 500×500 μm$^2$) which is slightly smaller than the cavity is placed on top of the glue. Thickness of the platelet (e.g. 50-100 μm) and depth of the cavity are preferably arranged such that the light entrance surface of the light converter 134 and the surrounding surface of the substrate 131 are on the same level. Small deviations may be acceptable. Both steps may be carried out in a dispense/p&p tool as typically used in the LED industry equipped with an ultra-high precision dispense valve. Afterwards the glue is cured, which typically implies an oven batch process.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
11 reflected laser light
20 converted light
100 laser-based light source
110 laser
130 light converting device
131 substrate
132 reflective side coating
133 bonding layer
134 light converter
137 reflective structure
138 ceramic protection layer

The invention claimed is:

1. A light converting device, comprising:
a substrate functioning as a heatsink,
a light converter adapted to convert laser light to converted light having a peak emission wavelength in a longer wavelength range than a peak emission wavelength of the laser light, the light converter comprising a light entrance surface, a bonding surface opposite to the light entrance surface and mechanically and thermally coupled to the substrate, and at least one side surface,
a reflective structure attached to or part of the substrate, arranged on the side of the substrate facing the light converter; and comprising at least one reflective metal surface arranged to reflect laser light and converted light, and
a translucent ceramic protection layer arranged between the reflective structure and the light converter and having a thickness of less than 50 μm.

2. The light converting device according to claim 1, wherein the thickness of the ceramic protection layer is less than 10 μm.

3. The light converting device according to claim 1, wherein the ceramic protection layer covers the reflective structure.

4. The light converting device according to claim 1, wherein the ceramic protection layer comprises at least one ceramic material selected out of the group of aluminum oxide, magnesium oxide, titanium oxide, and zirconium oxide.

5. The light converting device according to claim 1, wherein the ceramic protection layer comprises scattering structures for scattering the laser light and the converted light.

6. The light converting device according to claim 1, wherein the substrate comprises a metal, and wherein a surface of the metal comprises the at least one reflective metal surface.

7. The light converting device according to claim 1, wherein the reflective structure comprises at least one metal layer deposited on a surface of the substrate.

8. The light converting device according to claim 1, wherein the bonding surface of the light converter is mechanically and thermally coupled to the substrate by means of a bonding layer, wherein the bonding layer is arranged between the light converter and the ceramic protection layer.

9. The light converting device according to claim 1, wherein the light converting device further comprises a reflective side coating covering the at least one side surface of the light converter, wherein the reflective side coating is arranged to reflect laser light and converted light.

10. The light converting device according to claim 1, wherein the substrate comprises a slot, wherein the slot is arranged to host the light converter, and
wherein the light converter is positioned in the slot such that the bonding surface faces an inner bottom surface of the slot.

11. The light converting device according to claim 10, wherein the reflective structure and the ceramic protection layer cover at least the inner bottom surface and a side surface of the slot.

12. The laser-based light source, comprising:
the light converting device according to claim 1, and
at least one laser, wherein the at least one laser is adapted to emit the laser light.

13. A vehicle headlight comprising at least one laser-based light source according to claim 12.

* * * * *